United States Patent [19]
Ohtoshi et al.

[11] Patent Number: 4,735,822
[45] Date of Patent: Apr. 5, 1988

[54] METHOD FOR PRODUCING AN ELECTRONIC DEVICE HAVING A MULTI-LAYER STRUCTURE

[75] Inventors: Hirokazu Ohtoshi, Kawasaki; Masaaki Hirooka, Toride; Junichi Hanna; Isamu Shimizu, both of Yokohama, all of Japan

[73] Assignee: Canon Kabushiki Kaisha, Tokyo, Japan

[21] Appl. No.: 945,815

[22] Filed: Dec. 24, 1986

[30] Foreign Application Priority Data

Dec. 28, 1985 [JP] Japan .................................. 60-297833

[51] Int. Cl.⁴ ...................... H01L 21/203; B05D 3/06
[52] U.S. Cl. .................... 427/53.1; 136/258; 427/54.1; 427/74; 427/255.1; 427/255.2; 437/4; 437/101
[58] Field of Search .............. 148/174; 136/258 AM; 427/53.1, 54.1, 74, 86, 255.1, 255.2; 204/157.45; 437/4, 101, 106, 109

[56] References Cited

U.S. PATENT DOCUMENTS

| | | | |
|---|---|---|---|
| Re. 31,708 | 10/1984 | Gordon | 427/126.2 |
| 3,271,180 | 9/1966 | White | 430/319 |
| 3,288,829 | 11/1966 | Wilkinson | 556/43 |
| 3,306,768 | 2/1967 | Peterson | 427/255.3 |
| 3,473,978 | 10/1969 | Jackson et al. | 437/93 |
| 3,888,705 | 6/1975 | Fletcher et al. | 437/107 |
| 3,892,608 | 7/1975 | Kuhn | 437/67 |
| 3,907,616 | 9/1975 | Wiemer | 437/164 |
| 3,914,515 | 10/1975 | Kane et al. | 428/432 |
| 3,916,034 | 10/1975 | Tsuchimoto | 427/38 |
| 3,984,587 | 10/1976 | Lipp | 427/70 |
| 4,042,006 | 8/1977 | Engl et al. | 164/46 |

(List continued on next page.)

FOREIGN PATENT DOCUMENTS

| | | |
|---|---|---|
| 74212 | 3/1983 | European Pat. Off. . |
| 90586A | 10/1983 | European Pat. Off. . |
| 2830081 | 2/1979 | Fed. Rep. of Germany . |
| 59-199035 | 4/1983 | Japan . |
| 58-168215 | 10/1983 | Japan . |
| 60-43819 | 3/1985 | Japan .......................... 136/258 AM |
| 2038086-A | 7/1980 | United Kingdom . |
| 2148328A | 5/1985 | United Kingdom . |

OTHER PUBLICATIONS

M. Ohnishi et al., *Proceedings 6th E. C. Photovoltaic Solar Energy Conf.* (1985), pp. 677–681.

H. Sakai et al., *Proceedings 6th E. C. Photovoltaic Specialists Conf.* (1985), pp. 682–686.

T. Inoue et al., *Appl. Phys. Lett.*, vol. 43, pp. 774–776 (1983).

Gibbons et al., *Appl. Phys. Lett.* vol. 34 (12), Jun. 1979, p. 831.

Brodsky et al., *IBM Technical Disclosure Bulletin* vol. 22, 3391 (Jan. 1980).

Claassen et al., *J. Electrochem. Soc.* vol. 127, 194 (Jan. 1980).

Jastrzebski, *Jrnl. of Crystal Growth* vol. 63 (1963), pp. 493–526.

Matsumura et al., 18th IEEE Photovoltaic Specialists Conf., Conference (4/28/86), pp. 1277–1282.

*Primary Examiner*—Aaron Weisstuch
*Attorney, Agent, or Firm*—Fitzpatrick, Cella, Harper & Scinto

[57] ABSTRACT

A method for producing an electronic device having a multi-layer structure comprising one or more valence electron controlled semiconductor thin layers formed on a substrate, comprises forming at least one of said valence electron controlled semiconductor thin layers according to the photo CVD method and forming at least one of other constituent layers according to the method comprising introducing a gaseous starting material for film formation and a gaseous halogenic oxidizing agent having the property of oxidizing said starting material into a reaction space to effect chemical contact therebetween to thereby form a plurality of precursors including a precursor in an excited state and transferring at least one of these precursors into a film forming space communicated with the reaction space as a feed source for the constituent element of the deposited film.

16 Claims, 3 Drawing Sheets

U.S. PATENT DOCUMENTS

| | | | |
|---|---|---|---|
| 4,146,657 | 3/1979 | Gordon | 427/126 |
| 4,147,571 | 4/1979 | Stringfellow et al. | 437/128 |
| 4,220,488 | 9/1980 | Duchemin et al. | 437/87 |
| 4,239,811 | 12/1980 | Kemlage | 437/238 |
| 4,250,205 | 2/1981 | Constant et al. | 437/234 |
| 4,321,073 | 3/1982 | Blair | 65/3.31 |
| 4,357,179 | 11/1982 | Adams et al. | 437/19 |
| 4,397,933 | 8/1983 | Sugata et al. | 430/84 |
| 4,402,762 | 9/1983 | John et al. | 437/16 |
| 4,421,592 | 12/1983 | Shaskus et al. | 156/613 |
| 4,422,888 | 12/1983 | Stutius | 437/81 |
| 4,434,188 | 2/1984 | Kamo et al. | 427/39 |
| 4,436,769 | 3/1984 | Moss et al. | 427/252 |
| 4,448,801 | 5/1984 | Fukuda et al. | 427/39 |
| 4,459,163 | 7/1984 | MacDiarmid et al. | 148/174 |
| 4,462,847 | 7/1984 | Thompson et al. | 437/99 |
| 4,473,598 | 9/1984 | Ephrath et al. | 437/67 |
| 4,490,208 | 12/1984 | Tanaka et al. | 156/606 |
| 4,501,777 | 2/1985 | Rose | 427/255 |
| 4,504,329 | 3/1985 | Quinlan et al. | 437/81 |
| 4,504,518 | 3/1985 | Ovshinsky et al. | 427/38 |
| 4,505,949 | 3/1985 | Jelks | 427/38 |
| 4,509,997 | 4/1985 | Cockayne et al. | 437/126 |
| 4,522,662 | 6/1985 | Bradbury et al. | 437/89 |
| 4,522,663 | 6/1985 | Ovshinsky et al. | 148/403 |
| 4,527,007 | 7/1985 | Fuse | 136/256 |
| 4,532,199 | 7/1985 | Ueno et al. | 430/128 |
| 4,554,180 | 11/1985 | Hirooka | 427/248.1 |
| 4,595,601 | 6/1986 | Horioka et al. | 427/53.1 |
| 4,609,562 | 9/1986 | Isenberg et al. | 427/8 |
| 4,615,905 | 10/1986 | Ovshinsky | 427/39 |
| 4,624,736 | 11/1986 | Gee et al. | 156/643 |
| 4,624,906 | 11/1986 | Kawamura et al. | 430/84 |
| 4,637,127 | 1/1987 | Kurogi et al. | 437/57 |
| 4,637,938 | 1/1987 | Lee et al. | 427/53.1 |
| 4,645,689 | 2/1987 | Cox | 427/255.2 X |
| 4,652,463 | 3/1987 | Peters | 427/53.1 |
| 4,657,777 | 4/1987 | Hirooka | 427/39 |
| 4,670,086 | 6/1987 | Leamy | 156/620 |
| 4,671,970 | 6/1987 | Keiser et al. | 156/643 X |
| 4,689,093 | 8/1987 | Ishihara et al. | 437/5 |

METHOD FOR PRODUCING AN ELECTRONIC DEVICE HAVING A MULTI-LAYER STRUCTURE

BACKGROUND OF THE INVENTION

1. Field of the Invention

This invention relates to an electronic device having a multi-layer structure such as a thin film semiconductor device, a photovoltaic device, an image forming member for electrophotography, etc., and a method for producing the same.

2. Related Background Art

In the prior art, functional films, i.e., semiconductor thin films for electronic devices such as thin film semiconductor devices, imaging devices, etc., particularly amorphous or polycrystalline semiconductor films, are formed individually by suitable film forming methods from the standpoint of desired physical characteristics, uses, etc.

For example, for formation of an amorphous or polycrystalline, i.e., nonsingle crystalline, silicon film which is optionally compensated for lone pair electrons with a compensating agent such as hydrogen atoms (H) or halogen atoms (X), etc., (hereinafter abbreviated as "NON—Si (H,X)", particularly "A—Si (H,X)" when indicating amorphous silicon and "poly-Si (H,X)" when indicating polycrystalline silicon; the so-called microcrystalline silicon is included within the category of A—Si (H,X) as a matter of course), there have been employed the vacuum vapor deposition method, the plasma CVD (PCVD) method, the thermal CVD method, the reactive sputtering method, the ion plating method, the optical CVD method, etc. Generally, the plasma CVD method has been widely used and industrialized.

However, the reaction process for forming a silicon film according to the plasma CVD method which has been generalized in the prior art is considerably complicated as compared with the CVD method of the prior art, and its reaction mechanism involves not a few unclear points. Also, there are a large number of parameters for formation of a deposited film (for example, substrate temperature, flow rates and flow rate ratio of introduced gases, pressure during formation, high frequency power, electrode structure, structure of reaction vessel, evacuation rate, plasma generating system, etc.). Because of the dependency on such a large number of parameters, the plasma which is formed may sometimes become unstable, which often leads to marked deleterious effects on the deposited film. Besides, such parameters are characteristic of each apparatus and must be selected individually. Therefore, under the present situation, it is difficult to standardize the production conditions.

On the other hand, for a silicon deposited film to exhibit sufficiently satisfactory electrical or optical characteristics for particular uses, it is now accepted that the best way to form it is according to the plasma CVD method.

However, depending on the application use of a silicon film, bulk production with reproducibility may be required with satisfactory results in terms of enlargement of area, uniformity of film thickness, as well as uniformity of film quality. Therefore in the formation of silicon films according to the plasma CVD method, an enormous investment in the installation of a bulk production apparatus is indispensable and control means for such bulk production is complicated, with tolerance limits of control being narrow and control of apparatus being severe. These are pointed out as problems to be improved in the future.

Also, in the case of the plasma CVD method, since plasma is directly generated by high frequencies, microwaves, etc., in a film forming space in which a substrate for film formation thereon is placed, electrons or a number of other ionic species generated therein may damage a film being formed in the film forming process thereby lowering the film quality or causing non-uniformity of film quality.

Figure 4:
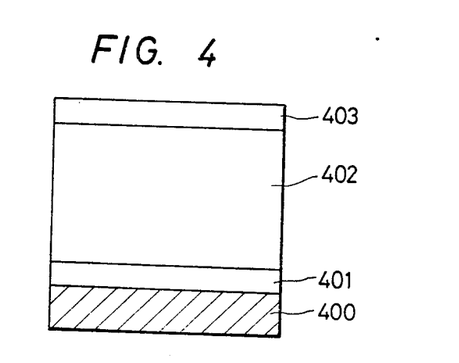
FIG. 4 is a schematic illustration of the layer constitution of an image forming member for electrophotography produced by the method of the present invention.

Particularly, in the case of producing an electronic device having a multi-layer structure, interface defects formed between the respective layers may cause worsening of the characteristics of the electronic device obtained. There is shown in FIG. 4 an image forming member for electrophotography as an example, which member comprises a substrate 400 made of aluminum, consisting of a charge injection preventing layer (first layer, amorphous silicon doped with boron B) 401, a photosensitive layer (second layer, amorphous silicon not doped with impurities such as B) 402, and a surface protective layer (third layer, amorphous silicon carbide) 403, respectively deposited on substrate 400. If all the layers are to be formed by the PCVD method, since the kinds of starting material gases, flow rates and plasma discharging intensity for formation of the respective deposited layers differ extremely from one another, effort is required to decrease the influence of the interfaces formed between the respective deposited layers, ordinarily by stopping the discharge between the steps for formation of the first layer and the second layer or for formation of the second layer and the third layer in order to completely exchange the gases, or if continuous production is to be employed, by providing a graded layer by varying gradually the kinds of gases, flow rates and plasma discharge intensity, or by providing separate deposition chambers for formation of the respective deposited layers. In any case, ions generated in the plasma bombard a deposited layer thereby to increase defects. Particularly, in producing an electronic device having a multi-layer constitution, the influence of ion bombardment is noticeably severe on the interfaces of respective layers. For this reason, satisfactory improvement therein is required.

As described above, in the formation of silicon films, problems to be solved still remain, and it has been desired to develop a method for forming a deposited film which is capable of bulk production with conservation of energy by the use of an apparatus of low cost, while maintaining the characteristics as well as uniformity of the films at a practically applicable level. Particularly, it has been desired to improve the interface characteristics of an electronic device having a multilayer structure such as a thin film transistor, photovoltaic device, photosensitive member for electrophotography, etc.

SUMMARY OF THE INVENTION

An object of the present invention is to remove such drawbacks for forming a deposited film as described above and at the same time to provide a novel method for producing an electronic device without the use of the formation method of the prior art and an electronic device obtained thereby.

Another object of the present invention is to provide a method capable of obtaining a deposited film with improved interface characteristics over a large area with easy control of film quality and conservation of energy.

Still another object of the present invention is to provide a method for producing an electronic device having a multi-layer structure which is excellent in bulk productivity, having high quality as well as excellent physical characteristics such as electrical, optical, and semiconductor characteristics.

According to the present invention, there is provided a method for producing an electronic device having a multi-layer structure comprising one or more valence electron controlled semiconductor thin layers on a substrate, which comprises forming at least one of said valence electron controlled semiconductor thin layers according to the photo CVD method and forming at least one of the other constituent layers according to the method comprising introducing a gaseous starting material for formation of a deposited film and a gaseous halogenic oxidizing agent having the property of oxidizing said starting material into a reaction space to effect chemical contact therebetween to thereby form a plural number of precursors including a precursor in an excited state and transferring at least one of these precursors into a film forming space communicated with the reaction space as a feed source for the constituent element of the deposited film (hereinafter abbreviated as FOCVD) and an electronic device obtained thereby.

According to the method for producing an electronic device of the present invention, a deposited film having a multi-layer constitution improved in interface characteristics is obtained and simplification of control and bulk production can be effected with satisfactory enlargement of area, uniformity of film thickness and quality simultaneously with conservation of energy, without requiring an enormous investment for installation of bulk production apparatus, and also the control parameters for bulk production are clarified to afford broad tolerance limits and simple control of apparatus.

DESCRIPTION OF THE PREFERRED EMBODIMENT

In the method for producing an electronic device of the present invention, the gaseous starting material to be used for formation of a deposited film (semiconductor thin film by the FOCVD method) is oxidized through chemical contact with a gaseous halogenic oxidizing agent and can be selected suitably as desired depending on the kind, characteristic, use, etc., of the deposited film to be obtained. In the present invention, the above gaseous starting material and the gaseous halogenic oxidizing agent need only be gaseous during chemical contact when introduced into a reaction space, and they can be either liquid or solid in their ordinary state.

When the starting material for formation of a deposited film or the halogenic oxidizing agent is liquid or solid, it is introduced into the reaction space in a gaseous state through bubbling with a carrier gas such as Ar, He, $N_2$, $H_2$, etc., optionally with application of heat.

During this operation, the partial pressures and mixing ratio of the above gaseous starting material and the gaseous halogenic oxidizing agent may be set by controlling the flow rate of the carrier gas and the vapor pressures of the starting material for the deposited film and the gaseous halogenic oxidizing agent.

As the starting material for the deposited film to be used in the FOCVD method of the present invention, for example, if a tetrahedral type deposited film such as semiconductive or electrically insulating silicon or germanium, etc., is desired to be obtained, straight or branched chain silane compounds, cyclic silane compounds, chain type germanium compounds, etc., may be employed. Specifically, examples of straight chain silane compounds may include $Si_nH_{2n+2}$, (n=1, 2, 3, 4, 5, 6, 7, 8), examples of branched chain silane compounds include $SiH_3SiH(SiH_3)$—$SiH_2SiH_3$, examples of cyclic silane compounds include $SiH_{2n}$, (n=3, 4, 5, 6) and examples of chain type germanium compounds include $Ge_mH_{2m+2}$ (m=1, 2, 3, 4, 5), etc. If a deposited film of tin is desired to be prepared, hydrogenated tin such as $SnH_4$ etc., may be employed as an effective starting material.

Of course, these starting materials may be used either singly or as a mixture of two or more kinds, and may also be used as the starting material gas for forming films according to the optical CVD method.

The halogenic oxidizing agent to be used in the present invention must be gaseous when introduced into the reaction space and at the same time must have the property of effectively oxidizing the gaseous starting material for film formation which is introduced into the reaction space by mere chemical contact therewith, and includes halogen gases such as $F_2$, $Cl_2$, $Br_2$, $I_2$, etc., and nascent fluorine, chlorine, bromine, etc.

The halogenic oxidizing agent is introduced into the reaction space in a gaseous state together with the starting material gas for film formation as described above at a desired flow rate and feed pressure, wherein it is mixed and reacted with the above starting material, thereby oxidizing the above starting material to efficiently generate a plurality of precursors including a precursor in a chemically excited state. Of the precursors in an excited state and other precursors which are generated, at least one of them functions as a feed source for the constituent element of the deposited film.

The precursors which are generated may undergo decomposition or reaction to be converted into other precursors in an excited state or to precursors in another excited state, or alternatively may be left in their original forms although, if desired, they may release energy on contact with the substrate surface arranged in the film forming space, whereby a deposited film with a three dimensional network structure is prepared when the substrate surface temperature is relatively low or a crystalline deposited film is formed when the substrate surface temperature is higher.

In the present invention, so that the film forming process may proceed smoothly to form a film of high quality and having desired physical characteristics, the film forming factors, i.e., the kinds and combination of the starting material and the halogenic oxidizing agent, their mixing ratio, pressure during mixing, flow rate, pressure in the film forming space, gas flow velocity and film forming temperature (substrate temperature and atmosphere temperature) are suitably selected as desired. These film forming factors are organically related to each other, and they are not determined individually but determined respectively under mutual relationships. In the present invention, the ratio of the gaseous starting material for film formation and the gaseous halogenic oxidizing agent introduced into the reaction space may be determined suitably in relation to the film forming factors as mentioned above, but it is preferably 1/20 to 100/1, more preferably 1/5 to 50/1, in terms of flow rate ratio of introduced gases.

The pressure during mixing when the gases are introduced into the reaction space may be preferably higher in order to enhance the probability of chemical contact between the above gaseous starting material and the above gaseous halogenic oxidizing agent, but it is better to determine the optimum value suitably as desired in view of reactivity. Although the pressure during mixing may be determined as described above, each pressure during introduction may be preferably $1 \times 10^{-7}$ atm to 5 atm, more preferably $1 \times 10^{-6}$ atm to 2 atm.

The pressure within the film forming space, namely the pressure of the space in which a substrate for film formation thereon is placed, may be set suitably as desired so that precursors (E) in an excited state generated in the reaction space and sometimes precursors (D) formed as secondary products from said precursors (E) may contribute effectively to film formation.

The pressure inside the film forming space, when the film forming space is communicated openly to the reaction space, can be controlled in relation to the introduction pressures and flow rates of the gaseous starting material for film formation and the gaseous halogenic oxidizing agent into the reaction space, for example, by use of e.g. a differential evacuation or large scale evacuating device.

Alternatively, when the conductance at the communicating portion between the reaction space and the film forming space is small the pressure in the film forming space can be controlled by providing an appropriate evacuation device to the film forming space and controlling the evacuation rate of said device.

On the other hand, when the reaction space and the film forming space are integral and the reaction position and the film forming position are only spatially different, it is possible to effect differential evacuation or provide a large scale evacuation device having sufficient evacuating capacity as described above.

As described above, the pressure in the film forming space may be determined according to the relationship between the introduction pressures of the gaseous starting material and the gaseous halogenic oxidizing agent introduced into the reaction space, but it is preferably 0.001 Torr to 100 Torr, more preferably 0.01 Torr to 30 Torr, optimally 0.05 to 10 Torr.

The gas flow velocity is selected in view of the geometric arrangement of the gas introducing port, the substrate, and the gas discharging port such that the starting material for film formation and the halogenic oxidizing agent may be efficiently mixed during introduction of these into the reaction space, whereby the precursors (E) may be efficiently generated and film formation may be adequately performed without trouble. A preferable example of the geometric arrangement is shown in FIG. 1.

The substrate temperature (Ts) during film formation is set as desired depending on the gas species employed and the type and required characteristics of the deposited film to be formed, but, in the case of obtaining an amorphous film, it is preferably from room temperature to 450° C., more preferably from 50° to 400° C. Particularly, in the case of forming a silicon film with better semiconductor and photoconductive characteristics, etc., the substrate temperature (Ts) should desirably be made 70° to 350° C. On the other hand, in the case of obtaining a polycrystalline film, it should preferably be 200° to 700° C., more preferably 300° to 600° C.

The atmosphere temperature (Tat) in the film forming space is determined in relationship with the substrate temperature so that the precursors (E) and (D) are not changed to unsuitable chemical species for film formation, and also the precursors (E) may be efficiently generated.

Figure 1:
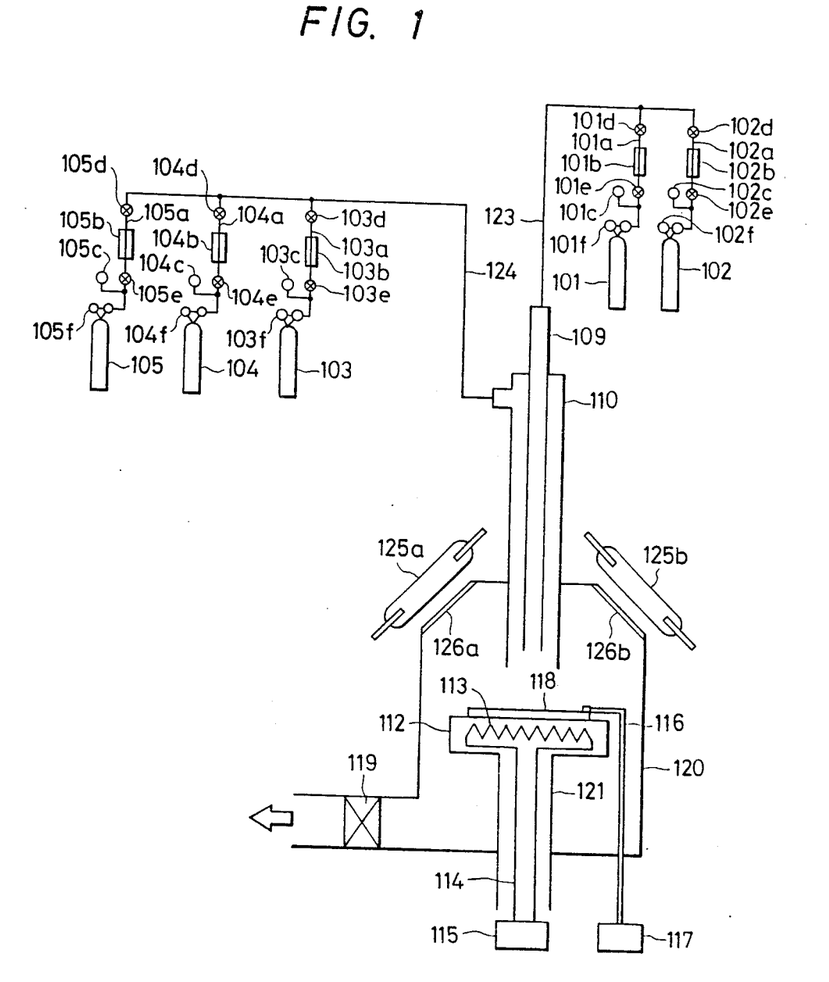
FIG. 1 is a schematic illustration of an apparatus for practicing the the present invention.

FIG. 1 shows an example of preferable apparatus for practicing the method of the present invention.

The apparatus shown in FIG. 1 is broadly divided into a main body (vacuum chamber), an evacuation system, and a gas feeding system.

In the main body, a reaction space and a film forming space are provided.

101–105 are respective tanks filled with the gases to be used during film formation, 101a–105a are respective gas feeding pipes, 101b–105b are respective mass flow controllers for controlling the flow rates of the gases from the respective tanks, 101c–105c are respective gas pressure gauges, 101d–105d and 101e–105e are respective valves, and 101f–105f are respective pressure gauges indicating the pressures in the corresponding gas tanks.

120 is a vacuum chamber equipped at the upper portion with a means for gas introduction, a reaction space downstream of the gas introduction means, and also having a film forming space in which a substrate holder 112 is provided so that a substrate 118 may be placed opposed to the gas introducing port of said gas introduction means. The means for gas introduction has a double concentric tubular structure, having from the innerside a first gas introducing pipe 109 for introducing gases from the gas tanks 101, 102, and a second gas introducing pipe 110 for introducing gases from the gas tanks 103–105.

For gas introduction to the reaction space from each gas introducing pipe, each position is designed so as to be arranged farther from the substrate surface as the pipe is nearer to the inner side. In other words, the gas introducing pipes are arranged so that the pipe on the outer side may enclose the pipe located within the inner side thereof.

The gases from the respective tanks are fed into the respective introducing pipes through the gas feeding pipelines 123–124, respectively.

The respective gas introducing pipes, the respective gas feeding pipelines and the vacuum chamber 120 are evacuated through a main vacuum valve 119 by means of an evacuating device not shown.

The substrate 118 is set at a suitable desired distance from the positions of the respective gas introducing pipes by vertically moving the substrate holder 112.

In the case of the present invention, the distance between the substrate and the gas introducing port of the gas introducing means may be determined appropriately in view of the kinds and desired characteristics of the deposited film to be formed, the gas flow rates, the pressure inside the vacuum chamber, etc., but it is preferably several mm to 20 cm, more preferably 5 mm to about 15 cm.

113 is a heater provided in order to heat the substrate to an appropriate temperature during film formation, or to preheat the substrate 118 before film formation, or further to anneal the film after film formation.

The substrate heater 113 is supplied with power through a conductive wire 114 from a power source 115.

116 is a thermocouple for measuring the temperature of the substrate (Ts) and is electrically connected to the temperature display device 117.

For supplying photon energy into the chamber 120, 125a and 125b are photon energy generating devices, and light is irradiated through windows 126a and 126b onto the substrate.

The layer to be formed by the photo CVD method is preferably formed by the use of such an apparatus as is adapted for utilization of both the FOCVD method and the photo CVD method as shown in FIG. 1. However, it may be formed by the use of a conventional photo CVD apparatus.

Figure 5:
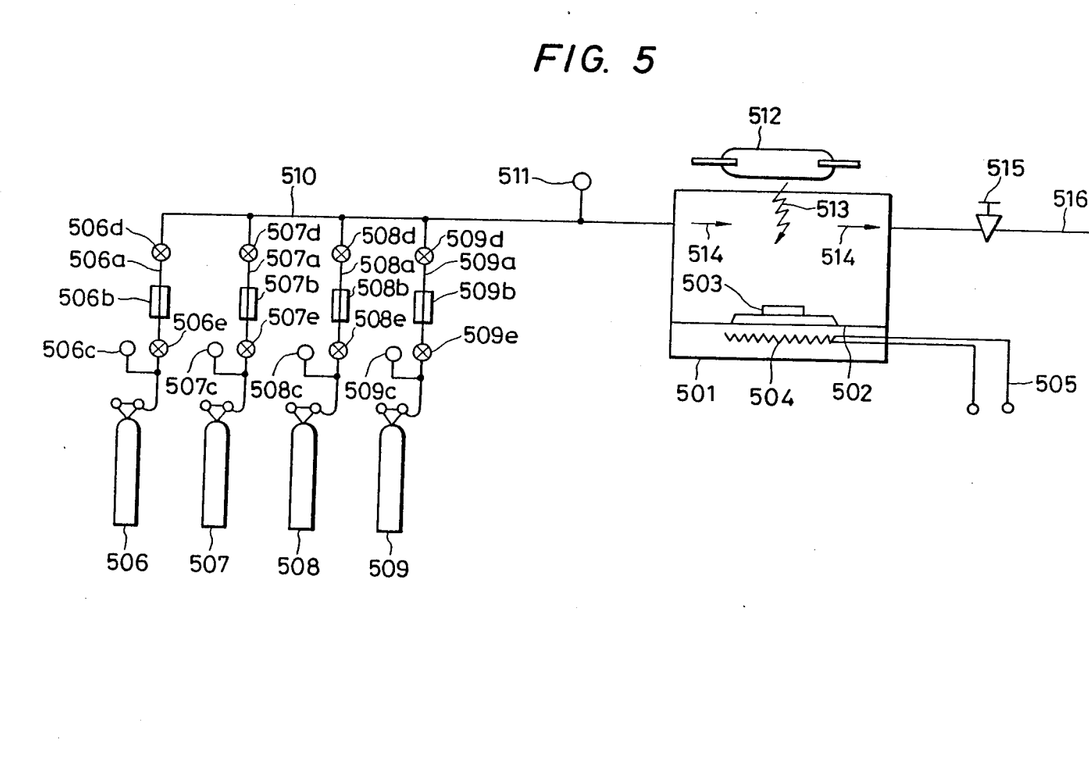
FIG. 5 is a schematic illustration of an apparatus for forming a film by the photo CVD method.

FIG. 5 shows an example of the apparatus for forming a deposited film according to the photo CVD method, in which 501 is a film forming chamber having a film forming space, and a desired substrate 503 is placed on a substrate supporting stand 502 provided therein.

504 is a heater for heating the substrate and is supplied with power through conductive wires 505 to generate heat.

506 through 509 are gas feeding sources and they are provided corresponding to the kinds of the gases used, including silicon containing compounds, hydrogen, halogen compounds, inert gas and compounds containing as a component an impurity element for valence electron control. Of these starting material compounds, when those which are liquid under standard state are used, a suitable gasifying device is provided. In the drawing, the numerals of gas feeding sources 506 through 509 affixed with the symbol a are branch pipes, those affixed with b flowmeters, those affixed with a pressure gauges for measuring the pressures on the higher pressure side of the respective flowmeters, those affixed with d or e valves for controlling the respective gas flow rates. The gases of the starting material compounds are introduced through the introducing pipe 510 into the film forming chamber 501.

512 is a photon energy generating device, which acts on the starting material gas flowing in the direction of the arrowhead 514 to excite and decompose the starting material gas to form a deposited film doped with a valence electron controller on the substrate 503 through chemical reaction of the decomposed compound. 515 is an evacuation valve, and 516 is an evacuation pipe, which is connected to an evacuation device (not shown) for vacuum evacuation of the film forming space.

When, for example, a deposited film doped with a valence electron controller is formed by use of such an apparatus, a suitable substrate 503 is placed on the supporting stand 502 and the film forming chamber 501 is internally evacuated to a reduced pressure through an evacuation pipe by use of an evacuation device (not shown).

Next, with heating of the substrate, if desired, starting material gases for film formation such as $SiH_4$, $N_2O$, $H_2$, etc. and the starting material gases for valence electron control such as $B_2H_6$, $PH_3$, etc., are introduced from the gas feeding sources through the gas introducing pipe 510 into the film forming chamber 501, and photon energy is supplied from the photon energy generating device into the film forming chamber 501 with the pressure in the film forming space being maintained at a predetermined pressure to form an A—Si:H:0:B film on the substrate 503.

In the method of the present invention, as the starting material gas to be introduced into the film forming space for formation of a silicon-containing deposited film according to the photo CVD method, silanes or halogenated silanes having hydrogen, halogen or hydrocarbon group bonded to silicon can be used. Above all, chain or cyclic silane compounds and those wherein hydrogen atoms are partially or wholly substituted with halogen atoms are preferred.

Specifically, for example, there may be included straight chain silane compounds represented by $Si_pH_{2p+2}$ ( p is an integer of 1 or more, preferably 1 to 15, more preferably 1 to 10) such as $SiH_4$, $Si_2H_6$, $Si_3H_8$, $Si_4H_{10}$, $Si_5H_{12}$, $Si_6H_{14}$, etc.; branched chain silane compounds represented by $Si_pH_{2p+2}$ (p has the same meaning as defined above) such as $SiH_3SiH(SiH_3)SiH_3$, $SiH_3SiH(SiH_3)$—$Si_2H_5$, $Si_2H_5SiH(SiH(SiH_3)Si_2H_5$, etc., these straight chain or branched silane compounds of which hydrogen atoms are partially or wholly substituted with halogen atoms; cyclic silane compounds represented by $Si_qH_{2q}$ (q is an integer of 3 or more, preferably 3 to 6) such as $Si_3H_6$, $Si_4H_8$, $Si_5H_{10}$, $Si_6H_{12}$, etc.; said cyclic silane compounds of which hydrogen atoms are partially or wholly substituted with other cyclic silanyl groups and/or chain silanyl groups; etc. Examples of the above silane compounds of which hydrogen atoms are partially or wholly substituted with halogen atoms may include halo-substituted chain or cyclic silane compounds represented by $SiH_rH_sX_t$ (X is halogen atom, r is an integer of 1 or more, preferably 1 to 10, more preferably 3 to 7, $s+t=2r+2$ or 2r) such as $SiH_3F$, $SiH_3Cl$, $SiH_3Br$, $SiH_3I$, etc. These compounds may be used either singly or as a combination of two or more compounds. Further, these starting material gases may be also used as diluted with an inert gas such as He, Ar, etc.

The valence electron controller to be used in the present invention may include, in the case of silicon type semiconductor films and germanium type semiconductor films, a p-type valence electron controller, namely compounds containing elements of group III of the Periodic Table functioning as the so-called p type impurity such as B, Al, Ga, In, Tl, etc., and an n-type valence electron controller, namely compounds containing elements of group V of the Periodic Table functioning as the so called n-type impurity such as N, P, As, Sb, Bi, etc.

Specifically, there may be included $NH_3$, $HN_3$, $N_2H_5N_3$, $N_2H_4$, $NH_4N_3$, $PH_3$, $P_2H_4$, $AsH_3$, $SbH_3$, $BiH_3$, $B_2H_6$, $B_4H_{10}$, $B_5H_9$, $B_5H_{11}$, $B_6H_{10}$, $B_6H_{12}$, $Al(CH_3)_3$, $Al(C_2H_5)_3$, $Ga(CH_3)_3$, $In(CH_3)_3$, etc. as effective ones.

The high energy light to be used in the method of the present invention may be generated from, for example, a low pressure mercury lamp, xenon lamp, carbonic acid gas laser, argon ion laser, excimer laser, etc. The light or photon energy to be used in the present invention is not limited to UV-ray energy, i.e. its wavelength is not limited, provided that it can excite, decompose or polymerize the starting material gas to deposit decomposed products. Also, the case when light energy is absorbed by the starting material gas or the substrate and converted to heat energy and excitation or decomposition or polymerization of the starting material gas is brought about by the heat energy to form a deposited film is not excluded from the invention.

In the present invention, the method for forming a deposited film doped with a valence electron controller is essentially different from that for formation of the deposited film having semiconductor characteristics not doped with a valence controller, but both of the deposited film forming means can be arranged in a single apparatus for forming deposited film. In this case, when either one of the deposited film forming means is employed, the other deposited film forming means is not employed.

Also, it is possible to arrange both of the deposited film forming means adjacent to each other but separated by a gate valve, etc. and to carry out formation of deposited films continuously.

The substrate to be used in the present invention may be either electroconductive or electrically insulating, provided that it is selected as desired depending on the use of the deposited film formed. As an electroconductive substrate, there may be mentioned metals such as NiCr, stainless steel, Al, Cr, Mo, Au, Ir, Nb, Ta, V, Ti, Pt, Pd, etc., or alloys thereof.

As an insulating substrate, there may be conventionally be used films or sheets of synthetic resins, including polyesters, polyethylene, polycarbonate, cellulose acetate, polypropylene, polyvinyl chloride, polyvinylidene chloride, polystyrene, polyamides, etc., glass, ceramics and so on. At least one side surface of these substrates is preferably subjected to a treatment for imparting electroconductivity, and it is desirable to provide other layers on the side at which said electroconductive treatment has been applied.

For example, electroconductive treatment of a glass substrate can be effected by providing a thin film of NiCr, Al, Cr, Mo, Au, Ir, Nb, Ta, V, Ti, Pt, Pd, $In_2O_3$, $SnO_2$, ITO ($In_2O_3+SnO_2$) thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc., or by a laminating treatment with such metals, thereby imparting electroconductivity to the surface. The substrate may be shaped in any form such as cylinders, belts, plates or others, and its form may be determined as desired.

The substrate should preferably be selected from among those set forth above in view of adhesion and reactivity between the substrate and the film. Further, if the difference in thermal expansion between both is great, a large amount of strain may be created within the film which sometimes gives films of poor quality, and therefore it is preferable to use a substrate wherein the difference in thermal expansion is small.

Also, the surface state of the substrate is directly related to the structure of the film (orientation) or generation of or a stylet structures, and therefore it is desirable to treat the surface of the substrate to give a film structure and a film texture so that desired characteristics may be obtained.

EXAMPLE 1

Figure 2:
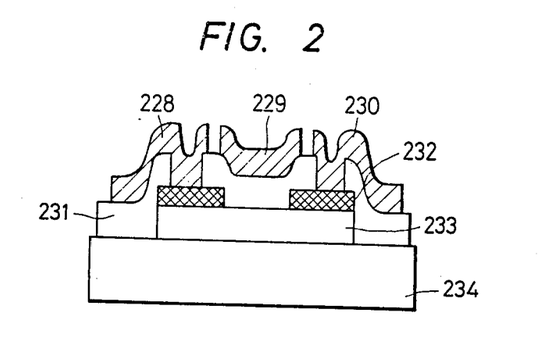
FIG. 2 is a schematic illustration of the layer constitution of a thin film transistor produced by the method of the present invention.

By use of the apparatus for forming a deposited film shown in FIG. 1, a thin film transistor shown in FIG. 2 (hereinafter referred to as "TFT") was prepared.

The above TFT is constituted of a glass substrate 234 (7059, produced by Corning Co.), an amorphous silicon layer (first layer, thickness 7000 A) 233, an amorphous silicon layer doped with phosphorus to a high concentration (second layer, thickness 500 A) 232, a silicon oxide layer (third layer, thickness 1000 A) 231, and Al electrodes 228, 229, 230.

In this example, in depositing the amorphous silicon layer 232 doped with phosphorus to a high concentration, $SiH_4$ gas from tank 101 was introduced at a flow rate of 20 sccm through the gas introducing pipe 109, $PH_3$/He gas ($PH_3$ concentration 1000 ppm) was fed from tank 103 at a flow rate of 3 sccm through the gas introducing pipe 110 and He gas was fed from tank 104 at a flow rate of 30 sccm through the gas introducing pipe 110, and irradiation of light was effected by use of low pressure mercury lamps 125a, 125b at 15 mW/cm$^2$.

The amorphous silicon layer 233 and the silicon oxide layer 231 were deposited by mixing and reacting a gaseous starting material for formation of a deposited film and a gaseous halogenic oxidizing agent having the property of oxidizing said starting material in the vacuum chamber 120 (by FOCVD).

For the amorphous silicon layer 233, $SiH_4$ gas from tank 101 was introduced at a flow rate of 20 sccm through the gas introducing pipe 109, $F_2$ gas from tank 104 at a flow rate of 10 sccm, and He gas from tank 107 was introduced at 100 sccm through the gas introducing pipe 110 into the vacuum chamber 120.

During this operation, the pressure in the vacuum chamber 120 was set at 0.7 Torr by controlling the opening of the vacuum valve 119. The distance between the gas introducing pipe 111 and the substrate was set at 3 cm. In the mixing region of $SiH_4$ gas and $F_2$ gas, blueish white luminescence was strongly observed.

For the silicon oxide layer 231, $SiH_4$ gas from tank 101 was introduced at a flow rate of 15 sccm through the gas introducing pipe 109, $N_2O$ gas from tank 106 was introduced at a flow rate of 15 sccm through the gas introducing pipe 109, $N_2O$ from tank 106 was introduced at a flow of 5 sccm and He gas from tank 107 was introduced at a flow rate of 30 sccm through the gas introducing pipe 111 into the vacuum chamber 120.

During this operation, the pressure in the vacuum chamber 120 was set at 0.3 Torr by controlling the opening of the vacuum valve 119.

During formation of all the layers, the substrate temperature was set at 250° C.

The TFT prepared by this Example exhibited an on-off ratio improved by about 15% as compared with the prior art product.

EXAMPLE 2

Figure 3:
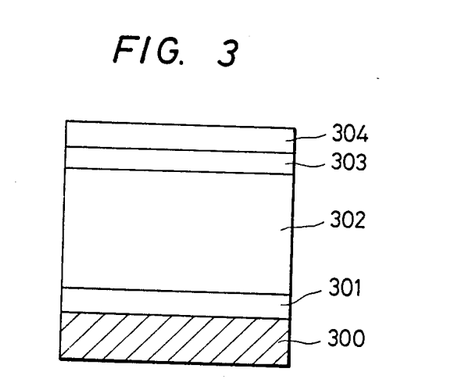
FIG. 3 is a schematic illustration of the layer constitution of a solar cell produced by the method of the present invention.

By use of the apparatus for forming a deposited film shown in FIG. 1, a solar battery having the layer constitution shown in FIG. 3 was produced.

The above solar battery is constituted of a Corning 7059 glass substrate 300 having a transparent electrode vapor deposited thereon, a p-type amorphous silicon layer (first layer, thickness 500 A) 301, an i-type amorphous silicon layer (second layer, thickness 1 μm) 302, an n-type amorphous silicon layer (third layer, thickness 500 A) 303, and an Al electrode 304.

The first layer 301 was deposited by the same photo CVD method as practiced in Example 1, and subsequently the second layer and the third layer were deposited by mixing and reacting in the vacuum chamber 120 the same gaseous starting material for film formation and the gaseous halogenic oxidizing agent having the property of oxidizing said starting material as used in Example 1 (by FOCVD).

The film forming conditions according to this Example are shown in Table 1.

The solar battery thus obtained exhibited a conversion efficiency improved by 20% as compared with the prior art product.

EXAMPLE 3

By use of the apparatus for forming a deposited film shown in FIG. 1, an image forming member for electrophotography having the layer constitution shown in FIG. 4 was prepared.

The above image forming member for electrophotography shown in FIG. 4 is constituted of a substrate 400 made of aluminum, a charge injection preventing layer (first layer, amorphous silicon layer doped with B, 0.5 μm) 401, a photosensitive member (second layer, amorphous silicon layer 18 μm) 402, and a surface protective layer (third layer, amorphous silicon carbide layer 0.1 μm) 403.

According to the method shown in Example 1, an image forming member for electrophotography was produced under the film forming conditions shown in Table 2.

The image forming member for electrophotography obtained by this Example exhibited charging characteristics improved by 25% or more, and also exhibited a reduced image defect number by about 10% as compared with the prior art product the respective layers of which are continuously formed by the PCVD method.

TABLE 1

(substrate temperature 250° C.)

| Layer constitution | Starting material | Flow rate (sccm) | Deposition method | Pressure (Torr) |
|---|---|---|---|---|
| First layer (p-type) | SiH$_4$ | 20 | Photo CVD | 0.3 |
|  | B$_2$H$_6$/He 2.5 (1000 ppm) |  |  |  |
|  | He | 20 |  |  |
| Second layer (i-type) | SiH$_4$ | 30 | FOCVD | 0.8 |
|  | F$_2$ | 30 |  |  |
|  | He | 200 |  |  |
| Third layer (n-type) | SiH$_4$ | 20 | FOCVD | 0.5 |
|  | PH$_3$/He (100 ppm) | 2 |  |  |
|  | F$_2$ | 15 |  |  |
|  | He | 100 |  |  |
| First layer (p-type) | SiH$_4$ | 25 | Photo CVD | 0.3 |
|  | B$_2$H$_6$/He 3.5 (1000 ppm) |  |  |  |
|  | N$_2$O | 9 |  |  |
|  | He | 25 |  |  |
| Second layer (i-type) | SiH$_4$ | 100 | FOCVD | 0.9 |
|  | F$_2$ | 80 |  |  |
|  | He | 250 |  |  |
| Third layer (A-SiC:H) | SiH$_4$ | 20 | PCVD | 0.4 |
|  | CH$_4$ | 300 |  |  |
|  | He | 10 |  |  |

We claim:

1. A method for producing an electronic device having a multi-layer structure comprising one or more valence electron controlled semiconductor thin layers formed on a substrate, which comprises forming at least one of said valence electron controlled semiconductor thin layers according to the photo CVD method and forming at least one of other constituent layers according to the method comprising introducing a gaseous starting material for film formation and a gaseous halogenic oxidizing agent having the property of oxidizing said starting material into a reaction space to effect chemical contact therebetween to thereby form a plurality of precursors including a precursor in an excited state and transferring at least one of these precursors into a film forming space communicated with the reaction space as a feed source for the constituent element of the deposited film.

2. A method for producing an electronic device according to claim 1, wherein said gaseous starting material is a chain silane compound.

3. A method for producing an electronic device according to claim 2, wherein said chain silane compound is a straight chain silane compound.

4. A method for producing an electronic device according to claim 3, wherein said straight chain silane compound is represented by the formula Si$_n$H$_{2n+2}$ (n is an integer of 1 to 8).

5. A method for producing an electronic device according to claim 2, wherein said chain silane compound is a branched chain silane compound.

6. A method for producing an electronic device according to claim 1, wherein said gaseous starting material is a silane compound having a silicon cyclic structure.

7. A method for producing an electronic device according to claim 1, wherein said gaseous starting material is a chain germane compound.

8. A method for producing an electronic device accoring to claim 7, wherein said chain germanium compound is represented by the formula Ge$_m$H$_{2m+2}$ (m is an integer of 1 to 5).

9. A method for producing an electronic device according to claim 1, wherein said gaseous starting material is a hydrogenated tin compound.

10. A method for producing an electronic device according to claim 1, wherein said gaseous starting material is a tetrahedral type compound.

11. A method for producing an electronic device according to claim 1, wherein said gaseous halogenic oxidizing agent contains a halogen gas.

12. A method for producing an electronic device according to claim 1, wherein said gaseous halogenic oxidizing agent contains fluorine gas.

13. A method for producing an electronic device according to claim 1, wherein said gaseous halogenic oxidizing agent contains chlorine gas.

14. A method for producing an electron device according to claim 1, wherein said gaseous halogenic oxidizing agent is a gas containing fluorine atoms as a constituent.

15. A method for producing an electronic device according to claim 1, wherein said gaseous halogenic oxidizing agent contains a halogen under nascent state.

16. A method for producing an electronic device according to claim 1, wherein said substrate is arranged at a position opposed to the direction in which said gaseous starting material and said gaseous halogenic oxidizing agent are introduced into said reaction space.

* * * * *

UNITED STATES PATENT AND TRADEMARK OFFICE
CERTIFICATE OF CORRECTION

PATENT NO. : 4,735,822           Page 1 of 3
DATED : April 5, 1988
INVENTOR(S) : HIROKAZU OHTOSHI, ET AL.

It is certified that error appears in the above-identified patent and that said Letters Patent is hereby corrected as shown below:

AT [56] IN THE REFERENCES

Other Publications, under "Matsumura et al.,", "Conference" should be deleted.

AT [75] IN INVENTORS

"Junichi Hanna;" should read --Jun-ichi Hanna;--.

COLUMN 3

Line 42, "the the" should read --the method of the--.

COLUMN 4

Line 23, "$SiH_{2n}$," should read --$Si_nH_{2n}$,--.

COLUMN 6

Line 2, "desired depending" should read --desired individually depending--.

COLUMN 7

Line 43, "with a" should read --with c--.

COLUMN 8

Line 25, "$Si_2H_5SiH(SiH(SiH_3)Si_2H_5$," should read --$Si_2H_5SiH(SiH_3)Si_2H_5$,--.

UNITED STATES PATENT AND TRADEMARK OFFICE
CERTIFICATE OF CORRECTION

PATENT NO. : 4,735,822
DATED : April 5, 1988
INVENTOR(S) : HIROKAZU OHTOSHI, ET AL.

It is certified that error appears in the above-identified patent and that said Letters Patent is hereby corrected as shown below:

COLUMN 10

Line 44, "15 sccm" should read --5 sccm--.
Line 44, "through the" should be deleted.
Line 45, "gas introducing pipe 109, $N_2O$ from tank 106 was intro-" should be deleted.
Line 46, "duced at a flow of 5 sccm" should be deleted.

COLUMN 11

Table 1, Lines 43-45, "$SiH_4$    20--
    $B_2H_6$/He 2.5
    (1000 ppm)
    He    20
should read --$SiH_4$    20 --.
    $B_2H_6$/He    2.5
    (1000 ppm)
    He    20

Table 1, Line 53, insert

| TABLE 2 (substrate temperature 250° C.) | | | | |
|---|---|---|---|---|
| Layer constitution | Starting material | Flow rate (sccm) | Deposition method | Pressure (Torr) |

UNITED STATES PATENT AND TRADEMARK OFFICE
CERTIFICATE OF CORRECTION

PATENT NO. : 4,735,822
DATED : April 5, 1988
INVENTOR(S) : HIROKAZU OHTOSHI, ET AL.

It is certified that error appears in the above-identified patent and that said Letters Patent is hereby corrected as shown below:

Table 1, Lines 53-55, "SiH$_4$         25--
                     B$_2$H$_6$/He 3.5
                     (1000 ppm)
                     N$_2$O          9
                     He             25
should read --SiH$_4$       25  --.
             B$_2$H$_6$/He   3.5
             (1000 ppm)
             N$_2$O          9
             He             25

COLUMN 12

Line 34, "germane" should read --germanium--.
Line 36, "coring" should read --cording--.
Line 54, "electron" should read --electronic--.

Signed and Sealed this

Fourteenth Day of February, 1989

Attest:

DONALD J. QUIGG

Attesting Officer    Commissioner of Patents and Trademarks